(12) United States Patent
Violette

(10) Patent No.: US 6,951,790 B1
(45) Date of Patent: Oct. 4, 2005

(54) METHOD OF FORMING SELECT LINES FOR NAND MEMORY DEVICES

(75) Inventor: Michael Violette, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/808,018

(22) Filed: Mar. 24, 2004

(51) Int. Cl.[7] .......................................... H01L 21/336
(52) U.S. Cl. ...................... 438/257; 438/314; 438/324
(58) Field of Search ................................ 438/241, 257, 438/261, 262, 264, 266, 268, 294, 299, 314, 438/324

(56) References Cited

U.S. PATENT DOCUMENTS

| | | |
|---|---|---|
| 6,355,522 B1 * | 3/2002 | Chang et al. ............. 438/257 |
| 6,709,729 B2 * | 3/2004 | Baruch ..................... 428/101 |
| 2004/0014286 A1 | 1/2004 | Park |

* cited by examiner

*Primary Examiner*—Phuc T. Dang
(74) *Attorney, Agent, or Firm*—Leffert Jay & Polglaze, P.A.

(57) ABSTRACT

Methods and apparatus are provided. A NAND memory array has a select line coupled to each of a plurality of NAND strings of memory cells of the memory array. The select line has a select gate at each intersection of one of the plurality of NAND strings and the select line. The select line further includes first and second conductive layers separated by a dielectric layer, and a contact that extends from a third conductive layer, disposed on the second conductive layer, to the first conductive layer. The contact is formed in a hole that passes through the second conductive layer and the dielectric layer and that terminates at the first conductive layer. The contact electrically connects the first and second conductive layers. The hole can have a slot shape so that the contact spans two or more NAND strings of the plurality of NAND strings.

19 Claims, 6 Drawing Sheets

6,951,790 B1

METHOD OF FORMING SELECT LINES FOR NAND MEMORY DEVICES

TECHNICAL FIELD OF THE INVENTION

The present invention relates generally to memory devices and in particular the present invention relates to select lines for NAND memory devices.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

A NAND flash memory device is a common type of flash memory device, so called for the logical form in which the basic memory cell configuration is arranged. Typically, the array of memory cells for NAND flash memory devices is arranged such that the control gate of each memory cell of a row of the array is connected to a word-select line. Columns of the array include strings (often termed NAND strings) of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a column bit line.

The memory array is accessed by a row decoder activating a row of memory cells by selecting the word-select line connected to a control gate of a memory cell. In addition, the word-select lines connected to the control gates of unselected memory cells of each string are driven to operate the unselected memory cells of each string as pass transistors, so that they pass current in a manner that is unrestricted by their stored data values. Current then flows from the source line to the column bit line through each NAND string via the corresponding select gates, restricted only by the selected memory cells of each string. This places the current-encoded data values of the row of selected memory cells on the column bit lines.

The floating-gate memory cells and the select lines are normally formed concurrently and include a first dielectric layer, e.g., an oxide, disposed on a substrate, such as silicon. A first conductive (or polysilicon) layer overlies the first dielectric layer, and a second dielectric layer, such as an oxide-nitride-oxide (ONO) layer, overlies the first conductive layer. A second conductive (or polysilicon) layer is disposed on the second dielectric layer, and a third conductive layer, such as a metal or polycide layer, is disposed on the second conductive layer and is in electrical contact therewith. A protective cap layer typically overlies the third conductive layer, and a bulk insulation layer (or dielectric layer) overlies the protective cap layer. The first dielectric layer acts as a tunnel dielectric layer for the floating-gate memory cells and a gate dielectric layer for the select line.

The first polysilicon layer of the memory cells forms a floating gate, while the second polysilicon layer and the metal or polycide layer form a control gate (or word line) that spans the entire array, e.g., all of the columns of memory cells (or NAND strings). The first and second polysilicon layers of the select lines are interconnected, or shorted together, to form a control gate that includes the first and second polysilicon layers and the metal or polycide layer and that that spans the entire array, e.g., all of the columns of the array.

Currently, the first and second polysilicon layers of the select lines are shorted at one location for a number of select gates. This is usually accomplished by forming a metal or polycide strap on the bulk insulation layer. A first contact is passed through the bulk insulation layer and the protective cap layer and contacts the metal or polycide layer, which is in electrical contact with the second polysilicon layer. An extension of the first polysilicon layer extends beyond the second dielectric layer, the second polysilicon layer, the metal or polycide layer, and the protective cap layer, and the bulk insulation layer is disposed on the extension of the first polysilicon layer. A second contact is passed through the bulk insulation layer and is connected between the strap and the extension of the first polysilicon layer so that the strap shorts the first and second polysilicon layers together. However, this requires extra processing steps, e.g., at least one additional etch. Moreover, for large memory arrays having a large number of columns, shorting the first and second polysilicon layers at one location results in select lines with relatively high resistance because the select lines are primarily of polysilicon. The relatively high resistance acts to slow down the operation of the select gates along the select line.

For the reasons stated above, and for other reasons stated below which will become apparent to those skilled in the art upon reading and understanding the present specification, there is a need in the art for alternative select lines for NAND memory devices.

SUMMARY

The above-mentioned problems with select lines for NAND memory devices and other problems are addressed by the present invention and will be understood by reading and studying the following specification.

For one embodiment, the invention provides a NAND memory array has a select line coupled to each of a plurality of NAND strings of memory cells of the memory array. The select line has a select gate at each intersection of one of the plurality of NAND strings and the select line. The select line further includes first and second conductive layers separated by a dielectric layer, and a contact that extends from a third conductive layer, disposed on the second conductive layer, to the first conductive layer. The contact is formed in a hole that passes through the second conductive layer and the dielectric layer and that terminates at the first conductive layer. The contact electrically connects the first and second conductive layers. For another embodiment, the hole is a slot that spans two or more NAND strings of the plurality of NAND strings so that the contact spans the two or more NAND strings of the plurality of NAND strings.

Further embodiments of the invention include methods and apparatus of varying scope.

DETAILED DESCRIPTION

Figure 1:
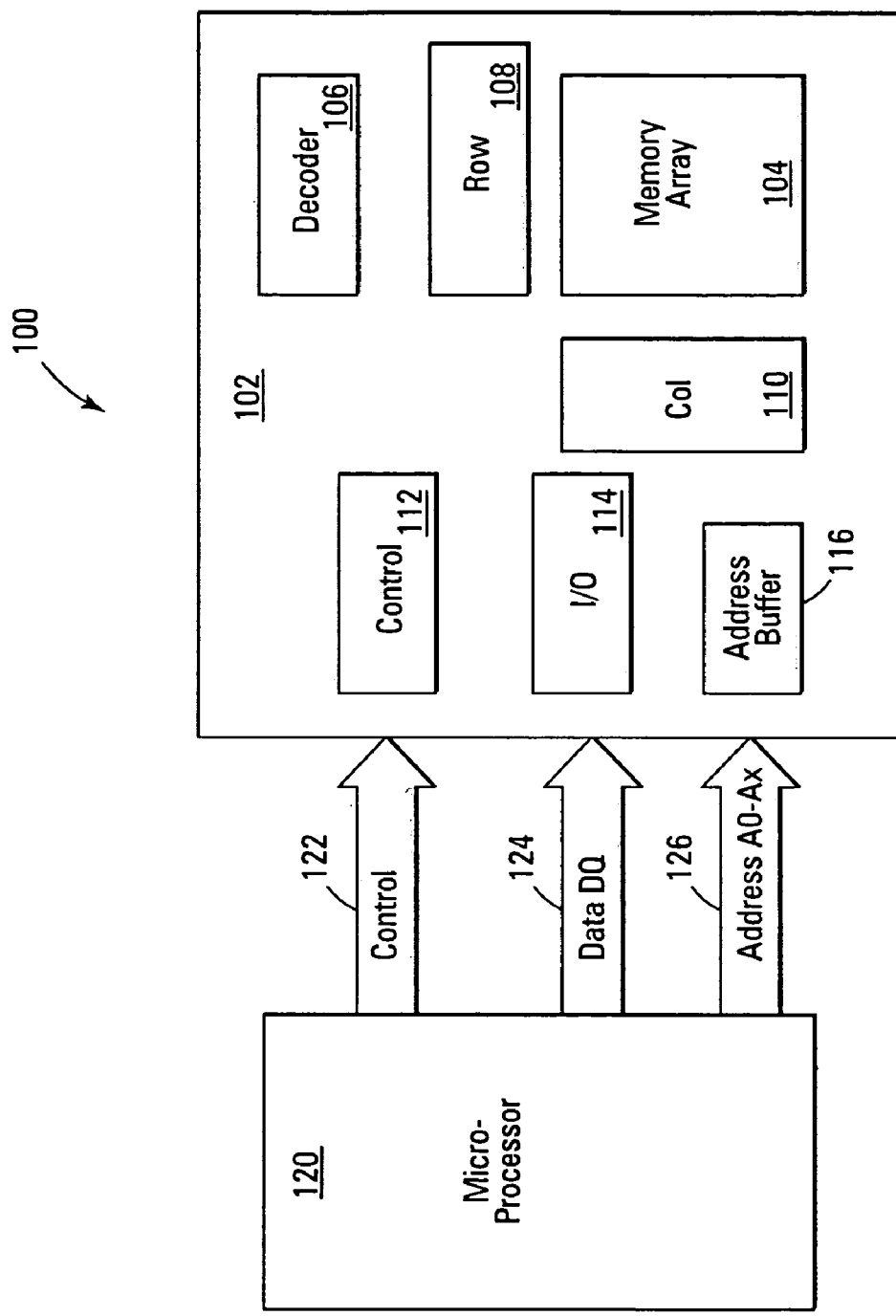
FIG. 1 is a simplified block diagram of a memory system according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a simplified block diagram of a memory system 100 according to an embodiment of the invention. Memory system 100 includes an integrated circuit flash memory device 102, e.g., a NAND memory device, that includes an array of flash memory cells 104, an address decoder 106, row access circuitry 108, column access circuitry 110, control circuitry 112, Input/Output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

Figure 2:
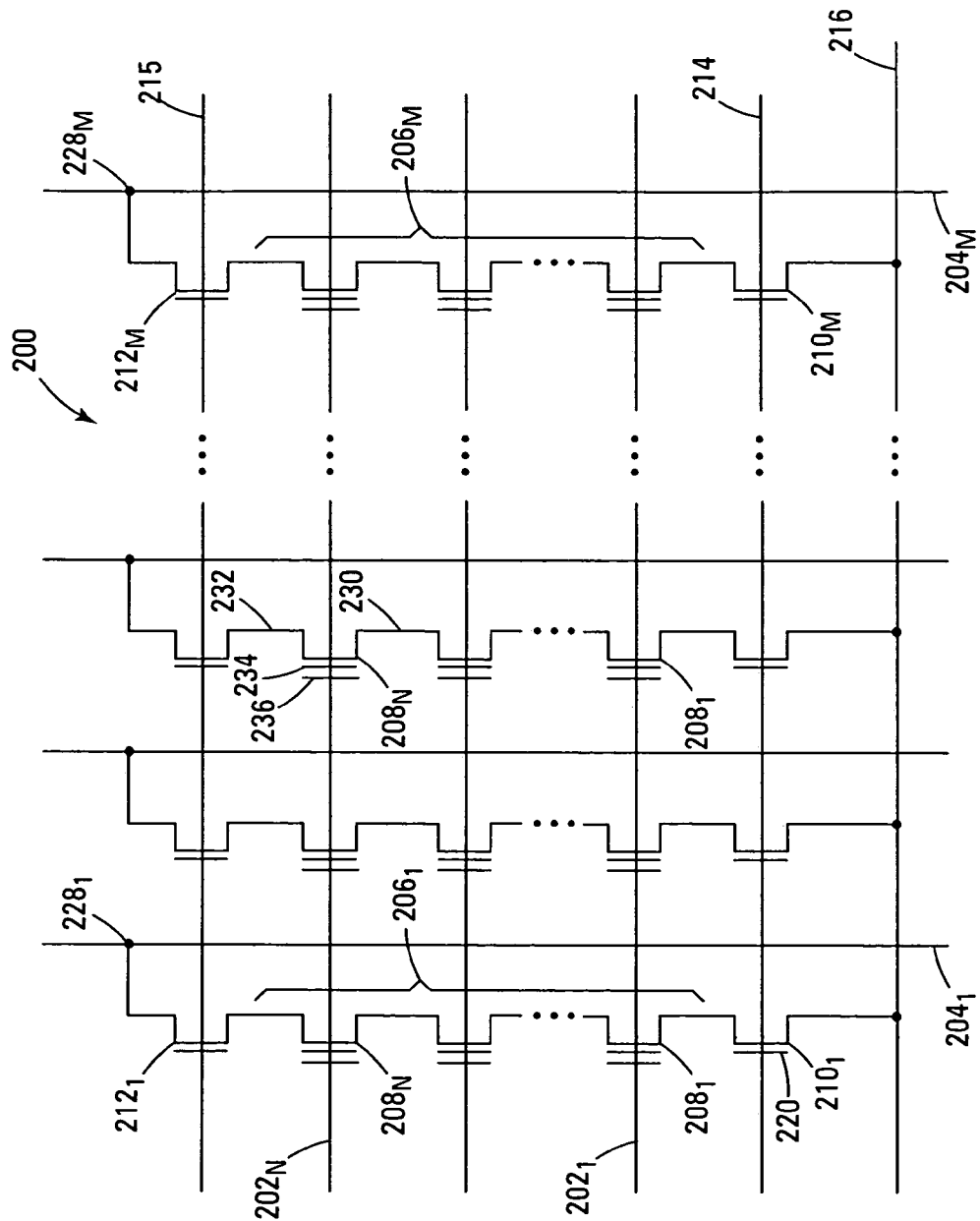
FIG. 2 is a schematic of a NAND memory array according to another embodiment of the invention.

FIG. 2 illustrates a NAND memory array 200 as a portion of memory array 104 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series source to drain between a source select line 214 and a drain select line 215. Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the floating-gate transistors 208 of each NAND string 206 are connected between a source select gate 210 and a drain select gate 212.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. Each source select gate 210 includes a control gate 220.

The drain of each drain select gate 212 is connected to the local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor $208_N$ of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of memory array 200 includes a NAND string 206 and the source and drain select gates connected thereto. A row of the floating-gate transistors 208 are those transistors commonly coupled to a given word line 202.

Figure 3:
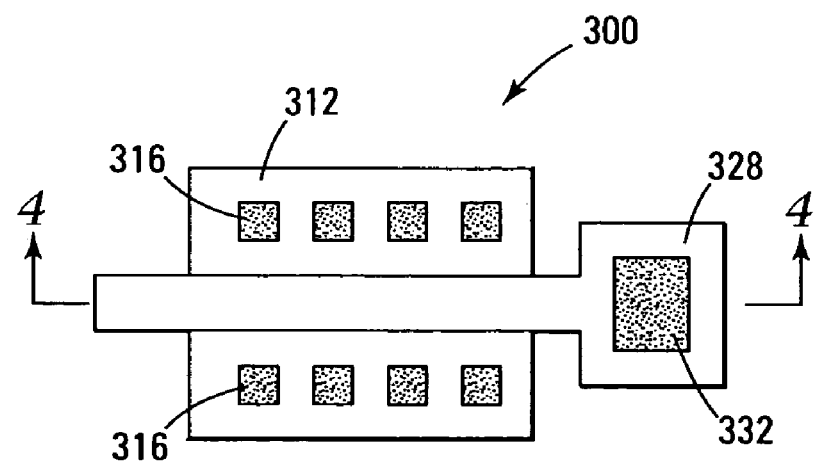
FIG. 3 is top view of a select line of a memory array according to another embodiment of the invention.
Figure 4:
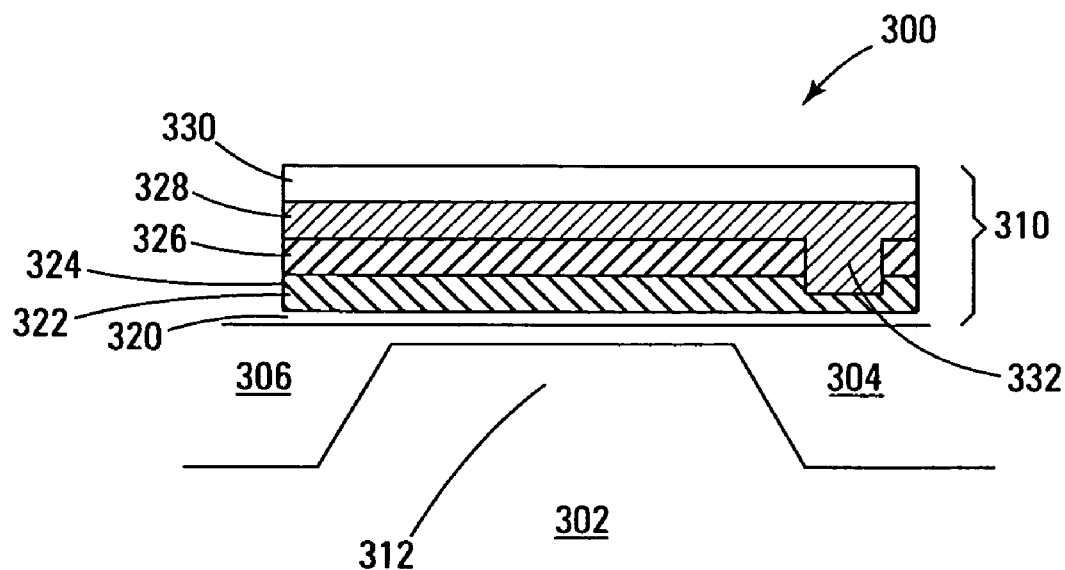
FIG. 4 is cross-sectional view taken along line 4—4 of FIG. 3.

FIGS. 3 and 4 are respectively top and cross-sectional views of a select line 300 of a portion of a memory array according to another embodiment of the present invention. FIG. 4 is taken along line 4—4 of FIG. 3. For one embodiment, select line 300 is a source select line, such as described for source select line 214 of memory array 200 of FIG. 2 or a drain select line, such as described for drain select line 215 of memory array 200. Select line 300 is formed on a substrate 302, e.g., of silicon. For one embodiment, isolation regions 304 and 306, such as shallow trench isolation (STI) regions, containing a dielectric material, such as an oxide, are formed in substrate 302. A gate stack 310 of select line 300 is formed on isolation regions 304 and 306 and on substrate 302 between isolation regions 304 and 306. The portion of gate stack 310 that is formed on substrate 302 between isolation regions 304 and 306 is an active region 312.

NAND strings, such as NAND strings 206 of array 200 of FIG. 2, are connected to select line 300 in the active region 312 so that select line 300 has a select gate, such as source select gate 210 or drain select gate 212 of array 200, at each intersection between a NAND string and select line 300. Each of the select gates are connected between a pair of source/drain regions 316 (shown in FIG. 3). For one embodiment, a select gate and a memory cell share one of source/drain regions 316.

As best seen in FIG. 4, a first (or gate) dielectric layer 320, e.g., an oxide layer, of gate stack 310 is disposed on substrate 302 and may extend over isolation regions 304 and 306. A first conductive (or polysilicon) layer 322 overlies the first dielectric layer 320, and a second (or interlayer) dielectric layer 324, such as an oxide-nitride-oxide (ONO) layer, overlies the first conductive layer 322. A second conductive (or polysilicon) layer 326 is disposed on interlayer dielectric layer 324, and a third conductive layer 328, such as a refractory metal or a refractory metal silicide layer, is disposed on the second conductive layer 326 and is in direct contact therewith. The metals of chromium (Cr), cobalt (Co), hafnium (Hf), molybdenum (Mo), niobium (Nb), tantalum (Ta), titanium (Ti), tungsten (W), vanadium(V) and zirconium (Zr) are generally recognized as refractory metals. The present invention is not limited to the second conductive layer 326 and third conductive layer 328 overlying interlayer dielectric layer 324. Rather, a single conductive layer of one or more conductive materials or three or more conductive layers can be disposed on interlayer dielectric layer 324. For one embodiment, a protective cap layer 330, such as TEOS (tetraethylorthosilicate), overlies the third conductive layer 328.

A contact (or conductive plug) 332 is connected to the third conductive layer 328 and extends from the third conductive layer 328 through the second conductive layer 326 and interlayer dielectric layer 324 and contacts the first conductive layer 322. In this way, contact 332 electrically connects (or shorts together) the first and second conductive layers. For one embodiment, contact 332 is formed over and substantially aligns with isolation region 304, as shown in FIG. 4. For another embodiment, contact 332 is integral with the third conductive layer 328. For another embodiment, a contact 332 is formed periodically, such as one contact 332 every 32 NAND strings.

Figure 5A:
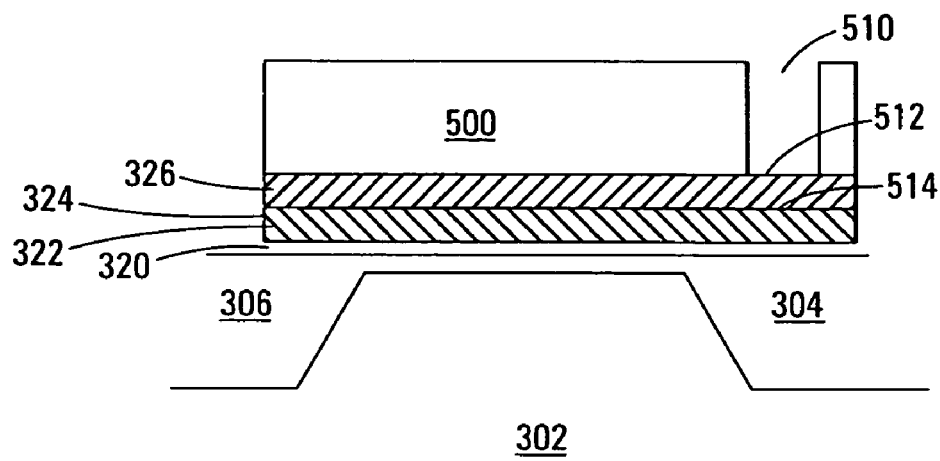
FIGS. 5A–5C are cross-sectional views of a portion of a memory array during various stages of fabrication according to another embodiment of the invention.

To form gate stack 310, first dielectric layer 320, the first conductive layer 322, interlayer dielectric layer 324, and the second conductive layer 326 are respectively formed as shown in FIG. 5A. A mask layer 500 is formed on the second conductive layer 326 to define areas for removal of the second conductive layer 326 and interlayer dielectric layer 324. As one example, mask layer 500 is a patterned photoresist layer as is commonly used in semiconductor fabrication. Specifically, the mask layer is patterned to include a region 510 for exposing a portion 512 of the second conductive layer 326 for forming a contact hole for containing contact 332.

Figure 5B:
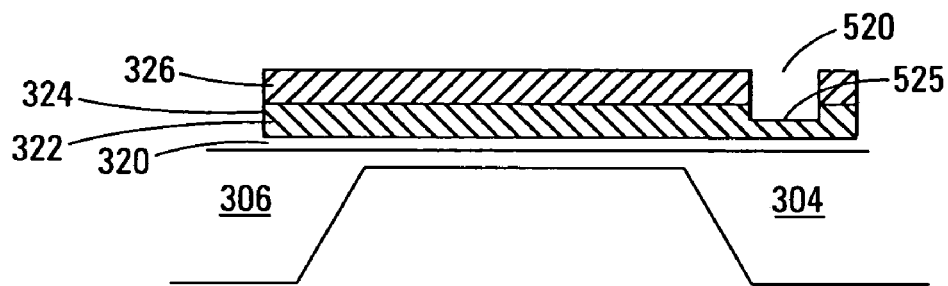
Figure 5C:
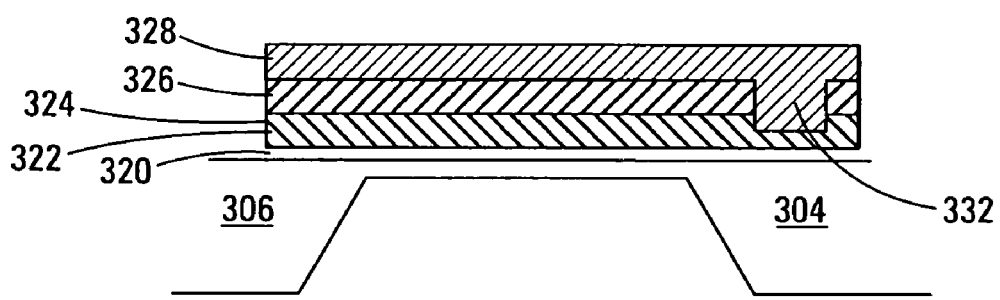

The exposed portion 512 of the second conductive layer 326 and a portion 514 of interlayer dielectric layer 324 directly underlying the exposed portion 512 of the second conductive layer 326 are then removed, e.g., by chemical or plasma etching, using the first conductive layer 322 as a stopping layer. This forms a hole 520 that passes through the second conductive layer 326 and interlayer dielectric layer 324 and that terminates at the first conductive layer 322, as shown in FIG. 5B, thereby exposing a portion 525 of the first conductive layer 322. The third conductive layer 328 is then deposited on the second conductive layer 326, sidewalls of hole 520, and the exposed portion 525 of the first conductive layer 322, e.g., using CVD, so as to fill hole 520, thereby forming contact 332, as shown in FIG. 5C. In addition to CVD, physical vapor deposition (PVD), e.g., sputtering, can be used. Cap layer 330 is then formed on the third conductive layer 328, to form the gate stack 310 of FIG. 4.

Note that only a single contact 332 shorts the first and second conductive layers together, whereas conventional methods utilize two contacts, which require additional processing steps.

Figure 6:
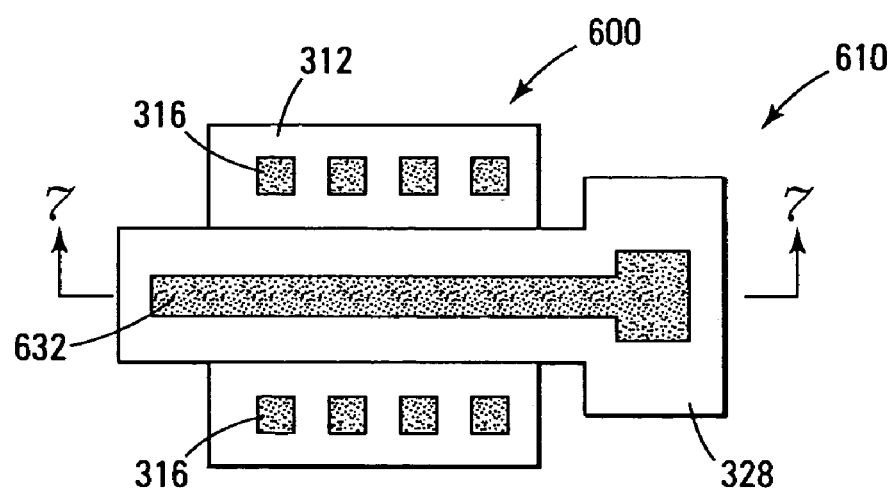
FIG. 6 is top view of a select line of a memory array according to another embodiment of the invention.
Figure 7:
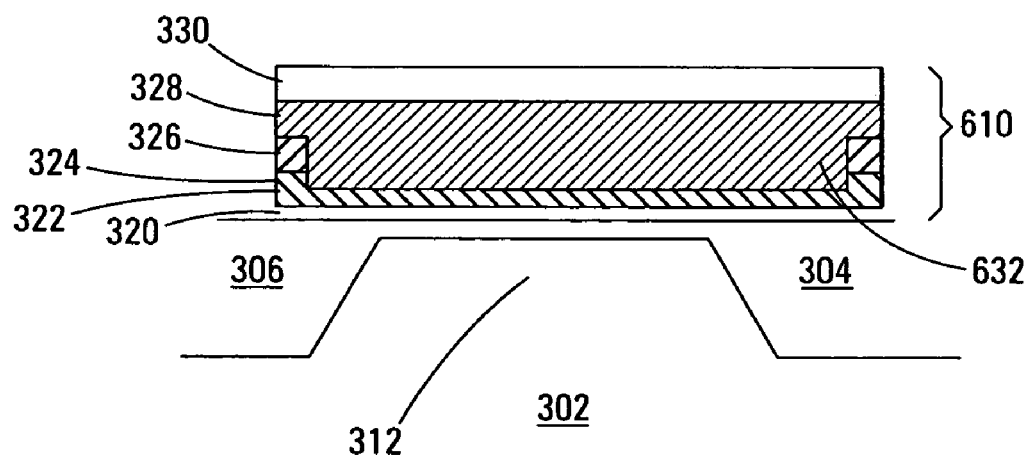
FIG. 7 is cross-sectional view taken along line 7—7 of FIG. 6.

FIGS. 6 and 7 are respectively top and cross-sectional views of a select line 600 of a memory array according to another embodiment of the present invention. FIG. 7 is taken along line 7—7 of FIG. 6. For one embodiment, select line 600 is a source select line, such as described for source select line 214 of memory array 200 of FIG. 2 or a drain select line, such as described for drain select line 215 of memory array 200. Elements common to FIGS. 3 and 4 and FIGS. 6 and 7 are commonly numbered and are as described above. A gate stack 610 of select line 600 is formed on isolation regions 304 and 306 and on substrate 302 between isolation regions 304 and 306. Gate stack 610 includes the first dielectric layer 320 disposed on substrate 302 and on isolation regions 304 and 306. The first conductive layer 322 overlies the first dielectric layer 320, and interlayer dielectric layer 324 overlies the first conductive layer 322. The second conductive (or polysilicon) layer 326 is disposed on interlayer dielectric layer 324, and the third conductive layer 328 is disposed on the second conductive layer 326 and is in direct contact therewith. For one embodiment, the protective cap layer 330 overlies the third conductive layer 328.

A contact (or conductive plug) 632 is connected to the third conductive layer 328 and extends from the third conductive layer 328 through the second conductive layer 326 and interlayer dielectric layer 324 and contacts the second conductive layer 326. In this way, contact 632 electrically connects (or shorts together) the first and second conductive layers. Contact 632 may extend between isolation regions 304 and 306 and span active region 312, as shown in FIG. 7. For another embodiment, contact 632 is integral with the third conductive layer 328.

Figure 8A:
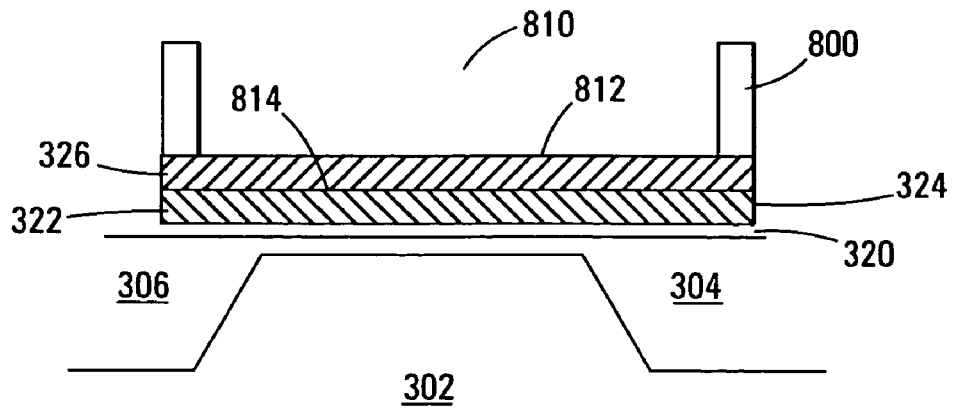
FIGS. 8A–8C are cross-sectional views of a portion of a memory array during various stages of fabrication according to another embodiment of the invention.

To form gate stack 610, the first dielectric layer 320, first conductive layer 322, interlayer dielectric layer 324, and the second conductive layer 326 are respectively formed as shown in FIG. 8A. A mask layer 800 is formed on the second conductive layer 326 to define areas for removal of the second conductive layer 326 and interlayer dielectric layer 324. As one example, mask layer 800 is a patterned photoresist layer as is commonly used in semiconductor fabrication. Specifically, the mask layer is patterned to include a region 810 for exposing a portion 812 of the second conductive layer 326 for forming a contact hole for containing contact 632.

Figure 8B:
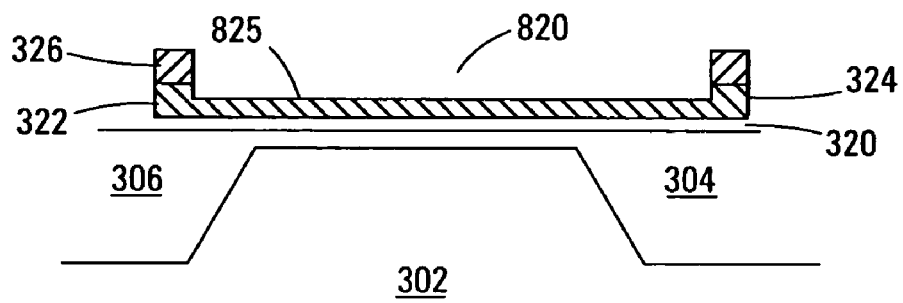
Figure 8C:
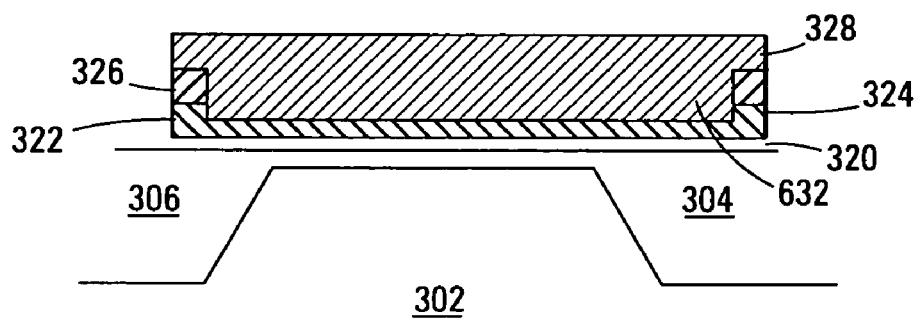

The exposed portion 812 of the second conductive layer 326 and a portion 814 of interlayer dielectric layer 324 directly underlying the exposed portion 812 of the second conductive layer 326 are then removed, e.g., by chemical or plasma etching, using the first conductive layer 322 as a stopping layer. This forms a slot-shaped contact hole (or slot) 820 that passes through the second conductive layer 326 and interlayer dielectric layer 324 and that terminates at the first conductive layer 322, as shown in FIG. 8B, thereby exposing a portion 825 of the first conductive layer 322. For one embodiment, slot 820 extends between isolation regions 304 and 306 and spans active region 312, as shown in FIG. 8B. The third conductive layer 328 is then deposited on the second conductive layer 326, sidewalls of slot 820, and the exposed portion 825 of the first conductive layer 322, e.g., using CVD, so as to fill slot 820, thereby forming contact 632, as shown in FIG. 8C. In addition to CVD, physical vapor deposition (PVD), e.g., sputtering, can be used. Cap layer 330 is then formed on the third conductive layer 328, to form the gate stack 610 of FIG. 7.

Note that only a single contact 632 shorts the first and second conductive layers together, whereas conventional methods utilize two contacts, which require additional processing steps. Moreover, contact 632 can short the first and second conductive layers together along the entire length of the select line 600 so that select line 600 has lower resistance than select lines having first and second conductive layers that are shorted together at a single location or periodically.

Select lines 300 and 600 have the same general structure as memory cells 208 of FIG. 2. That is, memory cells 208 have a first dielectric layer disposed on a substrate, a first conductive (or polysilicon) layer disposed on the first dielectric layer, a second (or interlayer) dielectric layer disposed on the first conductive layer, and a second conductive layer disposed on the interlayer dielectric layer. The second conductive layer can be a single layer of one or more conductive materials or two or more conductive layers, e.g., a polysilicon and a metal-containing layer. The first dielectric layer acts as a tunnel dielectric, the first conductive layer as a floating gate, and the second conductive layer as a control gate. Select line 300 or 600 and the memory cells can be formed concurrently.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming a portion of a NAND memory array, comprising:
    forming a select line coupled to each of a plurality of NAND strings of memory cells of the memory array, wherein the select line comprises a select gate at each intersection of one of the plurality of NAND strings and the select line; wherein forming the select line comprises:
        connecting first and second conductive layers of the select line that are separated by an interlayer dielectric using a contact that extends from a third conductive layer, formed on the second conductive layer, to the first conductive layer, the contact formed in a hole that passes through the second conductive layer and the interlayer dielectric layer and that terminates at the first conductive layer.

2. The method of claim 1, wherein the hole is slot that spans the plurality of NAND strings so that the contact spans the plurality of NAND strings.

3. The method of claim 1, wherein the hole is substantially aligned with an isolation region of the memory array.

4. The method of claim 1, wherein the first and second conductive layers are polysilicon layers and the third conductive layer is a metal-containing layer.

5. The method of claim 1, further comprising forming the first conductive layer on a dielectric layer overlying a substrate.

6. The method of claim 1, wherein forming a select line further comprises forming a source select line and a drain select line at opposite ends of each NAND string, wherein the source select line comprises a source select gate at each intersection of one of the plurality of NAND strings and the source select line, and the drain select line comprises a drain select gate at each intersection of one of the plurality of NAND strings and the drain select line.

7. A method of forming a portion of a NAND memory array, comprising:
    forming a plurality of NAND strings of memory cells;
    forming a select line coupled to each of the NAND strings, wherein the select line comprises a select gate at each intersection of one of the plurality of NAND strings and the select line, wherein forming the select line comprises:
        forming first and second conductive layers with an interposing dielectric layer; and
        electrically connecting the first and second conductive layers, wherein electrically connecting the first and second conductive layers comprises:
            forming a hole through the second conductive layer and the interlayer dielectric layer that terminates at the first conductive layer so as to expose a portion of the first conductive layer; and
            forming a third conductive layer on the second conductive layer and on sidewalls of the hole and the exposed portion of the first conductive layer to form a contact in the hole that electrically connects the first and second conductive layers.

8. The method of claim 7, wherein forming the hole further comprises forming a slot-shaped hole that spans two or more NAND strings of the plurality of NAND strings.

9. The method of claim 7, wherein forming the hole further comprises substantially aligning the hole with an isolation region of the memory array.

10. The method of claim 7, wherein the first and second conductive layers are polysilicon layers and the third conductive layer is a metal-containing layer.

11. The method of claim 7, further comprising forming the first conductive layer on a second dielectric layer overlying a substrate.

12. A method of forming a portion of a NAND memory array, comprising:
 forming a plurality of NAND strings of memory cells;
 forming a select line coupled to each of the NAND strings, wherein the select line comprises a select gate at each intersection of one of the plurality of NAND strings and the select line, wherein forming the select line comprises:
  forming a first dielectric layer on a substrate;
  forming a first conductive layer on the first dielectric layer;
  forming a second dielectric layer on the first conductive layer;
  forming a second conductive layer on the second dielectric layer;
  patterning the second conductive layer to expose a portion of the second conductive layer;
  removing the exposed portion of the second conductive layer and a portion of the second dielectric layer directly underlying the exposed portion of the second conductive layer to form a hole that passes through the second conductive layer and second dielectric layer and that terminates at the first conductive layer, thereby exposing a portion of the first conductive layer; and
  forming a third conductive layer on the second conductive layer and on sidewalls of the hole and the exposed portion of the first conductive layer to form a contact in the hole that electrically connects the first and second conductive layers.

13. The method of claim 12, wherein the hole is a slot that spans two or more NAND strings of the plurality of NAND strings so that the contact spans the two or more NAND strings of the plurality of NAND strings.

14. The method of claim 12, wherein forming the hole further comprises substantially aligning the hole with an isolation region formed in the substrate.

15. The method of claim 12, wherein the first and second conductive layers are polysilicon layers and the third conductive layer is a metal-containing layer.

16. The method of claim 15, wherein metal-containing layer comprises a material selected from the group consisting of refractory metals and refractory metal silicides.

17. The method of claim 12, wherein forming a select line further comprises forming a source select line and a drain select line at opposite ends of each NAND string, wherein the source select line comprises a source select gate at each intersection of one of the plurality of NAND strings and the source select line, and the drain select line comprises a drain select gate at each intersection of one of the plurality of NAND strings and the drain select line.

18. A method of forming a portion of a NAND memory array, comprising:
 forming a plurality of NAND strings of memory cells;
 forming a select line coupled to each of the NAND strings, wherein the select line comprises a select gate at each intersection of one of the plurality of NAND strings and the select line, wherein forming the select line comprises:
  forming a first dielectric layer on a substrate;
  forming a first polysilicon layer on the first dielectric layer;
  forming a second dielectric layer on the first polysilicon layer;
  forming a second polysilicon layer on the second dielectric layer;
  patterning the second polysilicon layer to expose a portion of the second polysilicon layer;
  removing the exposed portion of the second polysilicon layer and a portion of the second dielectric layer directly underlying the exposed portion of the second polysilicon layer to form a hole that is substantially aligned with an isolation region formed in the substrate, that passes through the second polysilicon layer and second dielectric layer, and that terminates at the first polysilicon layer, thereby exposing a portion of the first polysilicon layer; and
  forming a metal-containing layer on the second polysilicon layer and on sidewalls of the hole and the exposed portion of the first polysilicon layer to form a contact in the hole that electrically connects the first and second polysilicon layers and that substantially aligns with the isolation region.

19. A method of forming a portion of a NAND memory array, comprising:
 forming a plurality of NAND strings of memory cells;
 forming a select line coupled to each of the NAND strings, wherein the select line comprises a select gate at each intersection of one of the plurality of NAND strings and the select line, wherein forming the select line comprises:
  forming a first dielectric layer on a substrate;
  forming a first polysilicon layer on the first dielectric layer;
  forming asecond dielectric layer on the first polysilicon layer;
  forming a second polysilicon layer on the second dielectric layer;
  patterning the second polysilicon layer to expose a portion of the second polysilicon layer;
  removing the exposed portion of the second polysilicon layer and a portion of the second dielectric layer directly underlying the exposed portion of the second polysilicon layer to form a slot that spans two or more NAND strings of the plurality of NAND strings, that passes through the second polysilicon layer and second dielectric layer, and that terminates at the first polysilicon layer, thereby exposing a portion of the first polysilicon layer; and
  forming a metal-containing layer on the second polysilicon layer and on sidewalls of the slot and the exposed portion of the first polysilicon layer to form a contact in the slot that electrically connects the first and second polysilicon layers and that spans the two or more NAND strings of the plurality of NAND strings.

* * * * *